(12) United States Patent
Takehiro

(10) Patent No.: US 6,936,503 B2
(45) Date of Patent: Aug. 30, 2005

(54) METHOD FOR MANUFACTURING A MOS TRANSISTOR

(75) Inventor: Shinobu Takehiro, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 102 days.

(21) Appl. No.: 10/411,098

(22) Filed: Apr. 11, 2003

(65) Prior Publication Data

US 2003/0235965 A1 Dec. 25, 2003

(30) Foreign Application Priority Data

Jun. 24, 2002 (JP) .................................... P2002-182909

(51) Int. Cl.⁷ .................. H01L 21/335; H01L 21/8232
(52) U.S. Cl. .................. 438/142; 438/149; 438/197; 438/287; 438/584; 438/585; 438/591; 438/758; 438/761; 438/762; 438/765; 438/770; 438/775; 438/778; 438/787
(58) Field of Search ......................... 438/287, 591, 438/762, 775, 787, 142, 197, 770, 791, 149, 778, 758, 769, 765, 761, 585, 584

(56) References Cited

U.S. PATENT DOCUMENTS

| | | | | |
|---|---|---|---|---|
| 4,851,370 A | * | 7/1989 | Doklan et al. | 438/762 |
| 5,464,783 A | * | 11/1995 | Kim et al. | 438/591 |
| 5,464,792 A | * | 11/1995 | Tseng et al. | 438/585 |
| 5,972,800 A | * | 10/1999 | Hasegawa | 438/761 |
| 6,150,286 A | * | 11/2000 | Sun et al. | 438/791 |
| 6,245,616 B1 | * | 6/2001 | Buchanan et al. | 438/287 |
| 6,284,580 B1 | * | 9/2001 | Takehiro | 438/197 |
| 6,362,085 B1 | * | 3/2002 | Yu et al. | 438/585 |
| 6,399,519 B1 | * | 6/2002 | Ibok | 438/762 |
| 6,569,781 B1 | * | 5/2003 | Dokumaci et al. | 438/775 |
| 6,716,695 B1 | * | 4/2004 | Hattangady et al. | 438/240 |
| 6,727,134 B1 | * | 4/2004 | Chen et al. | 438/216 |
| 2002/0039844 A1 | * | 4/2002 | Lee | 438/778 |
| 2004/0023454 A1 | * | 2/2004 | Yao et al. | 438/216 |
| 2004/0147136 A1 | * | 7/2004 | Chen et al. | 4383/778 |

FOREIGN PATENT DOCUMENTS

JP 2001-274260 10/2001

* cited by examiner

Primary Examiner—Richard Elms
Assistant Examiner—Michael K. Luhrs
(74) Attorney, Agent, or Firm—Volentine Francos & Whitt, PLLC

(57) ABSTRACT

In a pretreatment process, a silicon oxide film (13) with nitrogen content is formed on a semiconductor substrate (10). In a segregation process executing heat treatment in an in-oxidiz-able gas atmosphere, a silicon nitride layer (14) segregates out at the interface of the silicon substrate (10) and the silicon oxide film (13). After this, the unnecessary silicon oxide film (13) on the silicon nitride layer (14) is removed, and a silicon oxide layer (15) is formed beneath the exposed silicon nitride layer (14) with oxygen passing through the exposed silicon nitride layer (14). Whereby, a gate electrode (16) is formed on the gate insulating film consisting of the silicon nitride layer (14) and the silicon oxide layer (15).

20 Claims, 4 Drawing Sheets

CORE CIRCUIT SECTION ←→ I/O CIRCUIT SECTION

METHOD FOR MANUFACTURING A MOS TRANSISTOR

BACKGROUND OF THE INVENTION

1. Field of the Invention

The present invention relates to a method for manufacturing a MOS transistor having multi-layered gate insulating film, and more particularly to a method for manufacturing a MOS transistor which can be made smaller with its gate insulating film made thinner and, at the same time, which can keep excellent operating characteristics.

2. Description of the Related Art

Recently, a gate insulating film of a MOS transistor is becoming thinner and thinner as integration density and operating speed become higher. This kind of gate insulating film is usually made up of an oxide film with nitrogen included in it. The reason why nitrogen is included is that the nitrogen atoms prevent impurities in the gate electrodes from diffusing into the oxide film. And, thus, decreasing efficiency of a gate insulating film can be prevented when the film becomes thinner.

Hereafter described are two examples of the conventional manufacturing method for forming a gate insulating film of a MOS transistor of this kind.

As the first example, there is a method of thermal process of heating silicon substrate's regions where MOS transistors are formed in a gas atmosphere including nitrogen atoms, such as nitrogen monoxide (NO) or nitrogen dioxide ($NO_2$) forming a film with SiON. This is a method generally used.

As the second example, conceived is a method of thermal process of heating silicon substrate's regions where MOS transistors are formed, in next processes. That is, these regions are heated, at first, in an oxide gas atmosphere to form oxide film. And, next, these regions are heated in a gas atmosphere including nitrogen atoms to form a film with SiON.

However, the conventional method mentioned above has a problem as follows.

That is, it has been pointed out by the inventor of present invention that nitrogen atoms existing in the oxide film become obstacles for a MOS transistor to operate in good condition, though they prevent impurities in gate electrodes from diffusing. The reason why nitrogen atoms become obstacles for MOS transistor to operate in good condition is conceived that the interface state density of the SiON film is higher than that of the SiO2 film. As a result, passage of charge carriers in the MOS transfer with SiON film is not so smooth as that with SiO2 film. And, this phenomenon becomes more remarkable as a gate insulating film becomes thinner. Therefore, an ideal gate insulating film is a multi-layered insulating film only which upper layer contains nitrogen atoms and which lower layer is a pure oxide film. But, this kind of gate insulating film cannot be obtained by the first conventional manufacturing method mentioned above.

Nor, cannot it be obtained by the second conventional manufacturing method, because nitrogen atoms are segregated into the oxide film in the thermal process. That is, it is vain to try forming upper layer containing nitrogen in an oxide film previously formed in an oxide gas atmosphere by the second method, because nitrogen atoms diffuse into the oxide film according to a phenomenon called segregation. And, nitrogen atoms reach to the bottom of the oxide film when the oxide film is as thin as they can reach there. As a result, what is formed by the second method becomes same as what is formed by the first method. So, this problem becomes more remarkable as the gate insulating film becomes thinner.

Therefore, the present invention is made, concerning especially to a MOS transistor having thin film structure, providing a method for manufacturing a MOS transistor having multi-layered gate insulating film with its upper layer including nitrogen atoms and its lower layer comprising pure oxide.

Meanwhile, the inventor of present invention previously made an invention of method for manufacturing a MOS transistor with thin gate insulating film (U.S. Pat. No. 6,284,580 B1). This method uses segregation process of silicon nitride layer to form a thin gate insulating film. And, lower layer of it is formed of silicon nitride. So, the above problem of not operating in good condition cannot be solved by the invention of this method.

SUMMARY OF THE INVENTION

Therefore, to solve the above problem, the present invention uses diffusing process as well as the segregation process of above method. So, the present invention adopts the following configuration.

According to the present invention, there is provided a method for manufacturing a MOS transistor having a gate insulating film formed on an active region of a silicon semiconductor substrate. This method comprises processes of forming a gate insulating film described as follows.

The first process is a pretreatment process of forming a silicon oxide film with nitrogen atoms on said active region.

The second process is a segregation process of forming a silicon nitride layer at an interface between said silicon oxide film with nitrogen atoms and said silicon substrate. This process is performed by heat-treating said silicon oxide film with nitrogen atoms in an in-oxidiz-able gas atmosphere to segregate nitrogen atoms out of said silicon oxide film.

The third process is a diffusion process of forming a silicon oxide layer at an interface between said silicon nitride layer and said silicon substrate by heat-treating the silicon nitride layer in an oxidiz-able gas atmosphere, after removing the unnecessary silicon oxide film which includes nitrogen atoms.

Moreover, as another method, a patterning process can be added before the segregation process for forming silicon nitride film. By adding this process, the nitride film is not formed in the patterned specific region. And, the diffusion process for forming silicon oxide film is performed to both the patterned region and the not patterned region.

According to the manufacturing method of present invention, silicon nitride layer is segregated in the interface between the silicon oxide film on the active regions and the silicon substrate by the segregation process. In this occasion, nitrogen atoms are included in the silicon oxide film on the active regions by the pretreatment process as mentioned above. Next, the unnecessary silicon oxide film on the silicon nitride layer is removed. And, silicon oxide layer is formed beneath the silicon nitride layer in the silicon substrate with oxygen atoms diffusing into there transferring through the exposed silicon nitride layer. By these processes, formed is a gate insulating film, which comprises multi-layered film of upper silicon nitride layer and lower silicon oxide layer. And, a gate electrode is formed on the gate insulating film.

Moreover, for the segregation process, an annealing process by rapid thermal annealing (RTA) may be adopted. By adopting this rapid thermal annealing process, the silicon nitride layer can made to segregate out more efficiently at the interface of the silicon oxide film and the silicon substrate.

DESCRIPTION OF PREFERRED EMBODIMENTS

The present invention will be described with reference to the embodiments shown in the accompanying drawings.
<Embodiment 1>

FIGS. 1(a) to 1(g) show the manufacturing steps of a first embodiment of the method for manufacturing steps of a MOS transistor according to the present invention.

In the embodiment shown in FIGS. 1(a) to 1(g), for the semiconductor substrate, a p-type silicon semiconductor substrate for example is used.

Figure 1A:
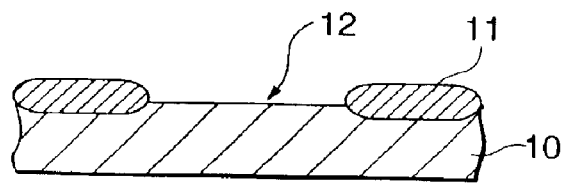
FIGS. 1(a) to 1(g) show the manufacturing steps of a first embodiment of the method for manufacturing a MOS transistor according to the present invention.

As shown in FIG. 1(a), on the surface of a p-type silicon semiconductor substrate, an active region 12 as a device forming region is delimited by isolation regions 11 about 50 nm to 300 nm in thickness made of field oxide film formed, for example, by the well-known LOCOS method.

Figure 1B:
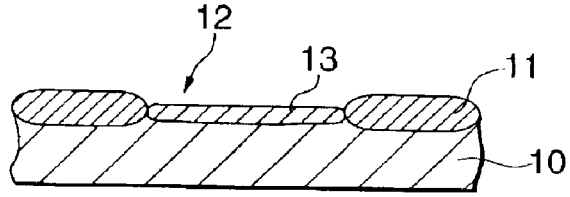

After the active region 12 is formed, the semiconductor substrate 10 is given the first heat treatment, that is, the first annealing in an atmosphere of di-nitrogen monoxide (nitrous oxide) gas ($N_2O$), for example. In this heat treatment, RTA (rapid thermal annealing) is preferably used, and by pretreatment by RTA at 700° C. to 1200° C., for example, a nitrogen-containing silicon oxide film 13 with a thickness of 1 nm to 20 nm, for example, is formed on the semiconductor substrate 10 as shown in FIG. 1(b).

Figure 1C:
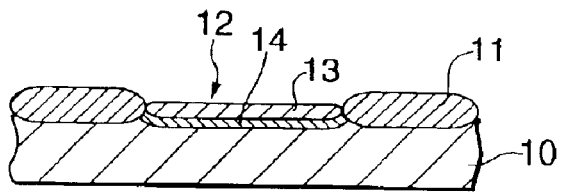

After the silicon oxide film 13 is formed, in an in-oxidizable gas such as nitrogen gas ($N_2$), the semiconductor substrate 10 undergoes the second heat treatment following the first heat treatment as pretreatment. This second heat treatment, in other words, the second annealing may be performed by RTA at 700° C. to 1200° C., for example, as in the pretreatment. By the second heat treatment, as shown in FIG. 1(c), a silicon nitride layer 14 is formed with a thickness of 0.1 nm to 5 nm for example between the semiconductor substrate 10 and the silicon oxide film 13 by segregation, that is, pile-up of nitrogen atoms from the silicon oxide film.

The nitrogen atom segregation phenomenon of the silicon nitride layer is described, for example, on pages 106 and 107 of SSDM (Solid State Devices and Materials, the Society of Applied Physics) 1998.

As the segregation process of the silicon nitride layer 14, a heat treatment other than RTA can be adopted. However, RTA mentioned above should preferably be adopted in terms of efficient formation, in other words, effective segregation of the silicon nitride layer 14.

Figure 1D:
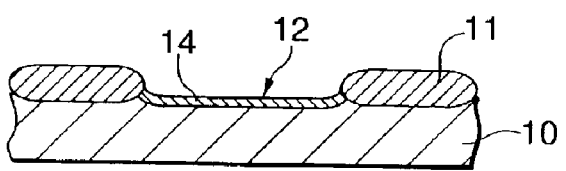

After the silicon nitride layer 14 is formed, the unnecessary silicon oxide film 13 on the silicon nitride layer 14 is removed as shown in FIG. 1(d). For removal of the silicon oxide film 13, etching can be done with a solution of 0.1% to 10% hydrofluoric acid, for example.

Figure 1E:
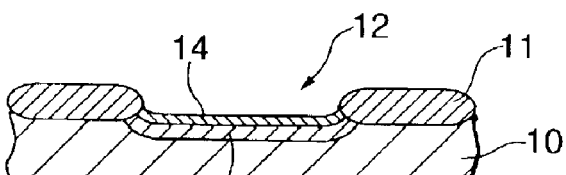

In the portion of silicon substrate located beneath the silicon nitride layer 14 exposed on the active region 12 by removal of the silicon oxide film 13, a silicon oxide layer ($SiO_2$) 15 is formed as shown in FIG. 1(e).

The silicon oxide layer 15 is formed with a thickness of 0.1 nm to 10 nm for example in an oxygen gas atmosphere by heat treatment at 700° C. to 1200° C. for example.

As the active region 12 is covered with the silicon nitride layer 14, in the formation of the silicon oxide layer 15, the growth of the silicon oxide layer 15 can be controlled effectively with the silicon nitride layer 14. Therefore, the formation of a thin multi-layered gate insulating film is easily carried out.

By these processes, a multi-layered gate insulating film (14 and 15) consisting of the silicon nitride layer 14 and the silicon oxide film 15 has been formed on the active region 12 of the semiconductor substrate 10.

Figure 1F:
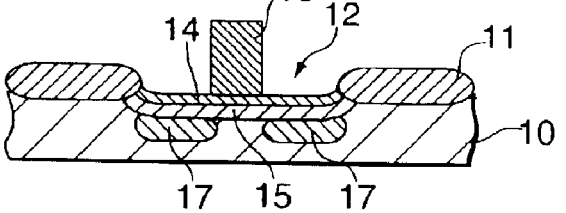

On the gate insulating film (14 and 15), after a titanium nitride (TiN), used as a gate electrode material, is formed by a well-known sputtering method, by photo-lithographic patterning and etching of the titanium nitride film, a gate electrode 16 is formed as shown in FIG. 1(f).

For example, phosphorus ions are introduced selectively into the active region 12 by ion implantation with the gate electrode 16 as a mask, and as the semiconductor substrate 10 receives heat treatment, a pair of diffused regions, that is, the well-known source and drain regions 17, 17 are formed in the active region.

Figure 1G:
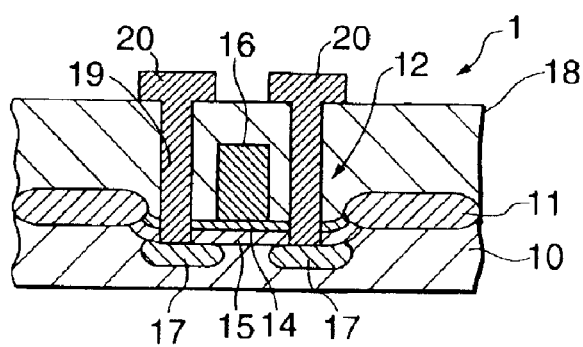

Subsequently, as shown in FIG. 1(g), to bury the gate electrode 16, an inter-layer dielectric 18 consisting of silicon oxide, for example, is formed on the semiconductor substrate 10 by CVD for example. As is well known, in the inter-layer dielectric 18, contact holes 19 open to the drain and source regions 17, 17 are formed by photolithography, for example. On the inter-layer dielectric 18, a metallic material, such as aluminum, is deposited by sputtering, for example, to fill the contact holes 19 with, and the unnecessary portions of the deposited metallic material are removed by a photo-lithographic technique, leaving wiring patterns 20 leading to the source and drain regions 17, 17. Thus, a MOS transistor 1 is formed.

In the foregoing, description has been made of an embodiment in which the silicon oxide film 13 with nitrogen content is formed with heat treatment. But, the present invention is not limited to this. It is also possible to form the silicon oxide film 13 with ion plantation. That is, nitrogen ions are implanted into the active region 12 from its surface at an accelerating voltage of 10 kV to 100 kV, for example. And, the semiconductor substrate 10 in which nitrogen atoms have been implanted into substantially the whole surface of the active region 12 by ion implantation is given heat treatment in an atmosphere of di-nitrogen monoxide ($N_2O$) gas. In this heat treatment, RTA is preferably carried out at 700° C. to 1200° C., for example. By pretreatment including this first heat treatment, a silicon oxide film 13 with nitrogen content, which is the same as the silicon oxide film shown in FIG. 1(b), is formed on the active region 12.

In the method for manufacturing a MOS transistor 1 according to the present invention, because the silicon nitride layer 14 is formed by segregation of nitrogen atoms between the silicon oxide film 13 and the semiconductor substrate 10 and the silicon oxide layer 15 is formed by diffusion of oxygen atoms passing through the silicon nitride layer exposed by getting rid of the unnecessary silicon oxide film 13, a multi-layered gate insulating film is formed consisting of silicon nitride layer 14 of upper portion and silicon oxide layer 15 of lower portion can be formed. Therefore, the operation of a MOS transistor can be kept in good condition with good conduction of carriers along the interface between silicon oxide layer 15 of lower portion and silicon substrate 10 while the invasion of impurities from gate electrode 16 to silicon oxide layer 15 of lower portion is prevented by the silicon nitride layer 14.

Moreover, by the segregation the thickness of the silicon nitride film 14 can be adequately controlled at such a small value as 0.1 nm or less, for example. Simultaneously by the control of oxide atom diffusion, the thickness of the silicon oxide film 15 can also be adequately controlled at such a small value as 0.1 nm or less, for example. Therefore a uniform thickness of gate insulating film can be achieved relatively easily.

Besides, because the silicon oxide film 13 with nitrogen content is formed by using ion implantation, nitrogen content can be efficiently introduced into the silicon oxide film 13. Therefore, after the pretreatment including this ion implantation, in the segregation step as the second heat treatment, the silicon nitride layer 14 can be made to segregate out more effectively.

Consequently, it becomes possible to decrease the heat treatment temperature for segregation and shorten the heat treatment time, with the result that heat treatment damage can be prevented, such as crystal dislocations and their propagation caused by high-heat treatment of the semiconductor substrate 10, and as the deterioration in performance by the heat treatment damage is prevented, the MOS transistor 1 will have improved its performance.

In the foregoing, as a gaseous atmosphere for pretreatment, a di-nitrogen monoxide gas (N2O) has been used. Alternatively, it is possible to suitably select a gaseous atmosphere containing nitrogen atoms, such as nitrogen monoxide (NO). In heat treatment as pretreatment, in place of RTA, an annealing process using an ordinary heating furnace or the like may be adopted.

For a gaseous atmosphere for the segregation process, not only nitrogen gas mentioned above but also an inert gas such as argon may be used. In the segregation process, as in the pretreatment, instead of RTA, an annealing process using an ordinary heating furnace or the like may be adopted.

When an annealing process using a heating furnace is adopted in the segregation process, a gaseous atmosphere at atmospheric or lower pressure may be used, but it is preferable to adopt a high-pressure atmosphere to achieve efficient segregation of nitrogen atoms.

<Embodiment 2>

FIGS. 2(a) to 2(g) show the manufacturing steps of a second embodiment of the method for manufacturing a MOS transistor according to the present invention.

The second embodiment embodies the present invention previously described as the first embodiment, this time as a manufacturing method of system LSI.

There are circuits of various kinds and forms on the same chip of a system LSI. So, it is necessary to form MOS transistors of various kinds and forms on a chip corresponding to these circuits. Among these circuits, core circuit section (main calculating circuit section) and I/O circuit section (input and output circuit section) are main configuration elements. By the way, in general, operation voltage is different between core circuit section and I/O circuit section. The reason is that I/O circuit section needs a certain amount of voltage for controlling the operation of I/O device outside of LSI. On the other hand, the voltage of core circuit section is not limited by device outside of LSI.

A MOS transistor generally becomes more efficient as its gate insulating film is made thinner. But, it cannot operate beyond the dielectric strength of its gate insulating film. So, its operating voltage must be made lower as it is made thinner. However, system LSI has a section where operating voltage cannot be lowered owing to outside factor such as I/O circuit section mentioned above. Thus, MOS transistors of high operating voltage and low operating voltage exist together on a chip of system LSI. So, there is next problem. That is, gate insulating film of MOS transistor on system LSI is getting thinner according as it gets more efficient. On the other hand, there are some sections where a certain minimum value is given to the thickness of gate insulating film. For this reason, MOS transistors having gate insulating films of various kinds of thickness are needed to be formed on the same chip.

However, MOS transistor having gate insulating film which has thickness more than certain value, cannot be formed on the same chip where MOS transistors with ultra-thin gate insulating film are formed, only by the method embodied in Embodiment 1 mentioned above.

Meanwhile, there is a conventional method for using patterned silicon nitride film to form various thickness of gate insulating films on the same chip. In this method, a thick oxide layer is formed in the substrate region beneath the non-pattered nitride film. At the same time, a thin oxide layer is formed in the substrate region beneath the patterned nitride film (JP2001-274260 i.e. JA2000-84339).

However, in this method, ultra-thin gate insulating film of less than 1 nm cannot be formed, because above mentioned nitride film is formed by diffusion process in an atmosphere containing nitrogen atoms.

Therefore, Embodiment 2 enables this by using segregation process as same as Embodiment 1.

In the embodiment shown in FIGS. 2(a) to 2(g), for the semiconductor substrate, a n-type silicon semiconductor substrate for example is used.

Figure 2A:
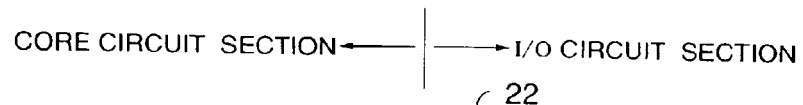
FIGS. 2(a) to 2(g) show the manufacturing steps of a second embodiment of the method for manufacturing a MOS transistor according to the present invention.
Figure 2B:
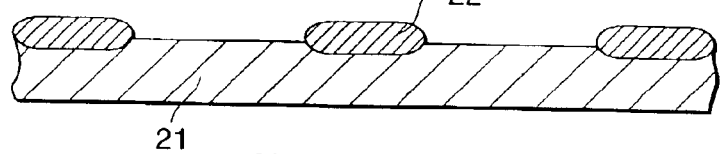

As shown in FIG. 2(a), on the surface of an n-type silicon semiconductor substrate 21, active regions as device forming regions are delimited by isolation regions 22 formed by LOCOS method. In the embodiment shown in the drawings, on the left region there is formed a core circuit section, and on the right region there is formed an I/O circuit section After these active regions are formed, the semiconductor substrate 21 is given the heat treatment in an atmosphere of oxygen gas, then on these active regions there formed are silicon oxide films of 0.1 nm to 10 nm for example. After this heat treatment, the semiconductor substrate 21 is given another heat treatment in an atmosphere of nitrogen monoxide gas (NO), for example. This is done at a temperature of 700° C. to 1200° C., for example, for a process time of 10 sec to 100 min. By this, nitrogen-containing silicon oxide films 23a, 23b with a thickness of 1 nm to 20 nm, for example, are formed on the active regions of semiconductor substrate 21 as shown in FIG. 2(b).

Figure 2C:
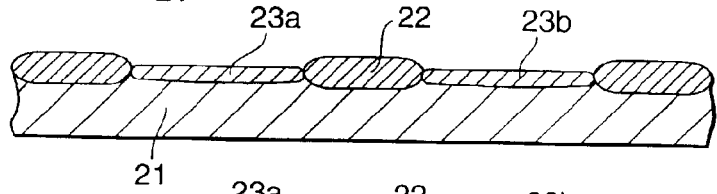

After this, in an in-oxidiz-able gas such as nitrogen gas (N2), the semiconductor substrate 21 undergoes the following heat treatment at 700° C. to 1200° C., for example. By this heat treatment, as shown in FIG. 2(c), silicon nitride layers 24a, 24b are formed with a thickness of 0.1 nm to 5 nm for example between the semiconductor substrate 21 and the silicon oxide films 23a, 23b by segregation of nitrogen atoms from the silicon oxide film.

Figure 2D:
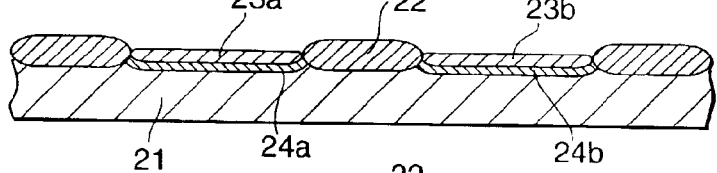

After this, the unnecessary silicon oxide films 23a, 23b on the silicon nitride layers 24a, 24b are removed as shown in FIG. 2(d), by etching with a solution of 0.1% to 10% hydrofluoric acid, for example.

Figure 2E:
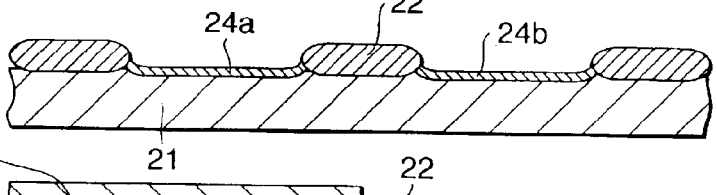

Here, as characteristic of Embodiment 2, as shown in FIG. 2(e), photo-resisting protection film 25 is formed by photo-lithographic patterning, on an active region where core circuit section is formed. With this photo-resisting protection film 25, a silicon nitride film 24b which exists on a region where I/O circuit section is formed, is removed by etching with a solution of 1% to 100% phosphoric acid for example.

Figure 2F:
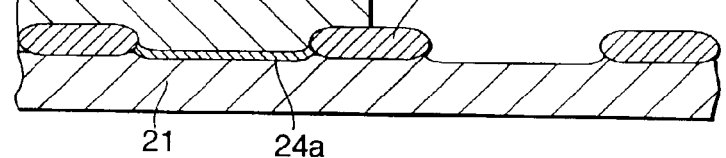

After this process, as shown in FIG. 2(f), a silicon oxide layer (SiO2) 26 is formed in silicon substrate 21, in an oxygen gas atmosphere by heat treatment at 700° C. to 1200° C. for example. At the same time, in the portion of silicon substrate 21 located beneath the silicon nitride layer 24a, a silicon oxide layer (SiO2) 27 is formed as well as Embodiment 1. This silicon oxide layer 27 is formed with a thickness of 0.1 nm to 10 nm for example, under diffusion control of the silicon nitride layer 24a as described referring to FIG. 1(e) of Embodiment 1.

By these processes, a multi-layered gate insulating film (24a and 27) consisting of the silicon nitride layer 24a and the silicon oxide film 27 has been formed on the active regions of the semiconductor substrate 21.

Figure 2G:
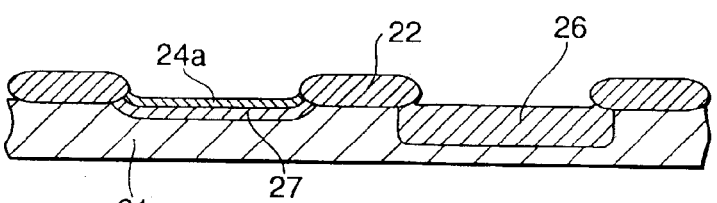

On the gate insulating film, after a titanium nitride (TiN), used as a gate electrode material, is formed by a well-known sputtering method, by photo-lithographic patterning and etching of the titanium nitride film, gate electrodes 28a, 28b are formed respectively as shown in FIG. 2(g).

For example, boron ions are introduced selectively into the active regions by ion implantation with the gate electrodes 28a, 28b as a mask. And, as the semiconductor substrate 21 receives heat treatment, a pair of diffused regions, that is, the well-known source and drain regions 29a, 29a and 29b, 29b are formed respectively in the active region. Thus, p-type MOS transistors 2,3 are formed.

In addition, subsequently, as same as shown in FIG. 1(g), to bury the gate electrodes 28a, 28b, an inter-layer dielectric is formed on the semiconductor substrate 21. And, in the inter-layer dielectric, contact holes open to the drain and source regions 29a, 29a and 29b, 29b are formed. On the inter-layer dielectric, aluminum etc. is deposited to fill the contact holes with. And, wiring patterns leading to the source and drain regions 29a, 29a and 29b, 29b are formed by a photo-lithographic technique.

As described above, in the method for manufacturing MOS transistors 2,3 according to Embodiment 2 of the present invention, a MOS transistor 2, which is formed in core circuit section, is made to have ultra-thin film with high efficiency as well as the MOS transistor according to Embodiment 1. At the same time, a MOS transistor 3, which is formed in I/O circuit section, is made to have high operating voltage. Moreover, impurities are not likely to reach to the interface between silicon oxide film 26 and substrate 21, because the silicon oxide film 26 has a certain thickness. So, deterioration of operating characteristic is not likely to occur owing to impurities invading from the gate electrode 28b. Therefore, including of nitrogen atoms to prevent these impurities from invading into the silicon oxide film 26 is not needed. Taking this effect in consideration, unnecessary nitrogen atoms are not introduced into the silicon oxide film 26 which comprises gate insulating film of MOS transistor 3 in Embodiment 2. In spite of this, MOS transistor 3 keeps high operating characteristic, because the silicon oxide film 26 has a certain thickness. Further, the thickness of silicon oxide film 24a can be freely controlled by segregation. And, the thickness of silicon oxide film 27 formed by diffusion can be controlled by the thickness of silicon nitride film 24a. In this occasion, the thickness of silicon oxide film 26 is decided in proportion to the thickness of silicon nitride film 24a. Thus, difference between the thickness of silicon oxide film 26 and 27 can be freely controlled by segregation, and diffusion after the segregation.

<Embodiment 3>

FIGS. 3(a) to 3(g) show the manufacturing steps of a third embodiment of the method for manufacturing a MOS transistor according to the present invention.

The third embodiment embodies the present invention previously described as the first embodiment, this time as a manufacturing method of system LSI having both MOS transistors of p-type and n-type.

The extent of deteriorating MOS transistor operation is different with the kind of impurities. The extent is large in the occasion of boron. And, the extent is small in the occasion of phosphorus. Therefore, it is not so necessary for n-type MOS transistor to include nitrogen atoms. And, it necessary is p-type MOS transistor to include them.

However, Embodiment 1 mentioned above could not deal with this difference of necessity.

Therefore, Embodiment 3 enables this.

Figure 3A:
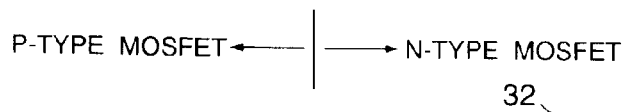
FIGS. 3(a) to 3(g) show the manufacturing steps of a third embodiment of the method for manufacturing a MOS transistor according to the present invention.

As shown in FIG. 3(a), on the surface of a silicon semiconductor substrate 31, active regions as device forming regions are delimited by isolation regions 32 formed by LOCOS method. In the embodiment shown in the drawings, on the left region there is formed a p-type MOS transistor, and on the right region there is formed an n-type MOS transistor.

Figure 3B:
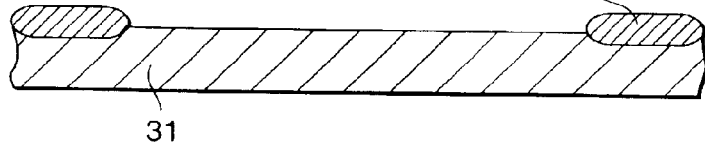

After these active regions are formed, the semiconductor substrate 31 is given the heat treatment in an atmosphere of oxygen gas as well as each Embodiment mentioned above, then on these active regions there formed are silicon oxide films of 0.1 nm to 10 nm for example. After this heat treatment, the semiconductor substrate 31 is given another heat treatment in an atmosphere of nitrogen monoxide gas (NO), for example. By this, a nitrogen-containing silicon oxide film 33 with a thickness of 1 nm to 20 nm, for example, are formed on the active regions of semiconductor substrate 31 as shown in FIG. 3(b).

Figure 3C:
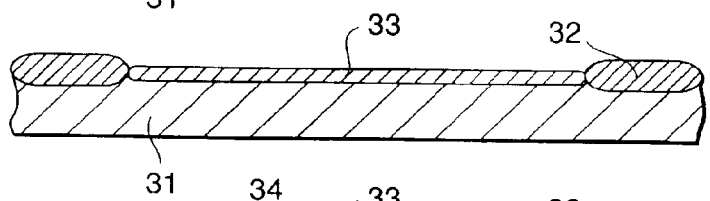

After this, in an in-oxidiz-able gas such as nitrogen gas (N2), the semiconductor substrate 31 undergoes the following heat treatment at 700° C. to 1200° C., for example. By this heat treatment, as shown in FIG. 3(c), silicon nitride layers 34 is formed with a thickness of 0.1 nm to 5 nm for example between the semiconductor substrate 31 and the silicon oxide film 33 by segregation of nitrogen atoms from the silicon oxide film.

Figure 3D:
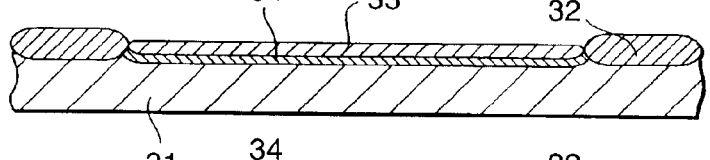

After this, the unnecessary silicon oxide film 33 on the silicon nitride layer 34 is removed as shown in FIG. 3(d), by etching with a solution of 0.1% to 10% hydrofluoric acid, for example.

Figure 3E:
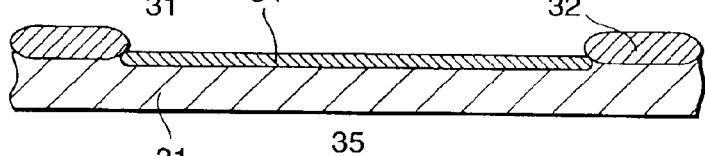

Here, as characteristic of Embodiment 3, as shown in FIG. 3(e), photo-resisting protection film 35 is formed by photo-lithographic patterning, on an active region where p-type MOS transistor is formed. With this photo-resisting protection film 35, silicon nitride film 34 which exists on a region where n-type MOS transistor is formed, is removed by etching with a solution of 1% to 100% phosphoric acid for example. After this, the photo-resisting protection film 35 is removed.

Figure 3F:
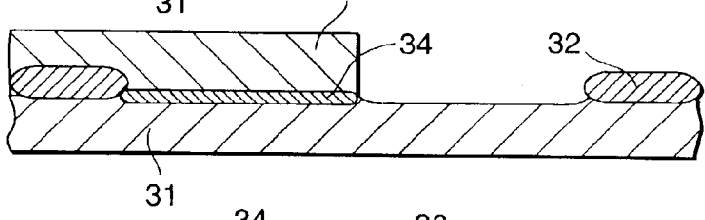

After this process, as shown in FIG. 3(f), silicon oxide layer (SiO2) 36 is formed in silicon substrate 31, in an oxygen gas atmosphere by heat treatment at 700° C. to 1200° C. for example. At the same time, in the portion of silicon substrate 31 located beneath the silicon nitride layer 34, a silicon oxide layer (SiO2) 37 is formed as well as Embodiment 1. This silicon oxide layer 37 is formed a little under diffusion control of silicon nitride layer 34.

By these processes, not only a multi-layered gate insulating film (34 and 37) consisting of the silicon nitride layer 34 and the silicon oxide film 37 has been formed on the active region of the semiconductor substrate 31. But also a single-layered gate insulating film consisting of the silicon oxide layer 36 is formed there.

Figure 3G:
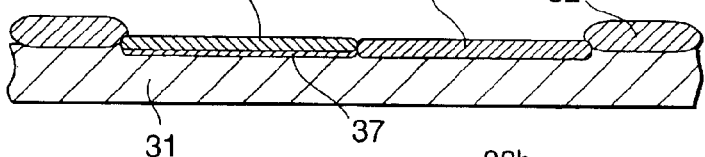

On the gate insulating film, gate electrodes 38a, 38b are formed respectively as shown in FIG. 3(g).

For example, boron ions are introduced selectively into the active regions by ion implantation with the gate electrodes 38a, 38b as a mask. And, as the semiconductor substrate 31 receives heat treatment, a pair of diffused regions, that is, the well-known source and drain regions 39a, 39a and 39b, 39b are formed respectively in the active region. Thus, p-type MOS transistor 4 and n-type MOS transistor 5 are formed respectively.

In addition, processes hereafter performed are same as each Embodiment.

As described above, in the method for manufacturing MOS transistors 4,5 according to Embodiment 3 of the present invention, including of nitrogen atoms into the gate insulating film is performed only at the portion of p-type MOS transistor 4. By this, deteriorating the operation of n-type MOS transistor 5 can be prevented.

<Embodiment 4>

Figure 4A:
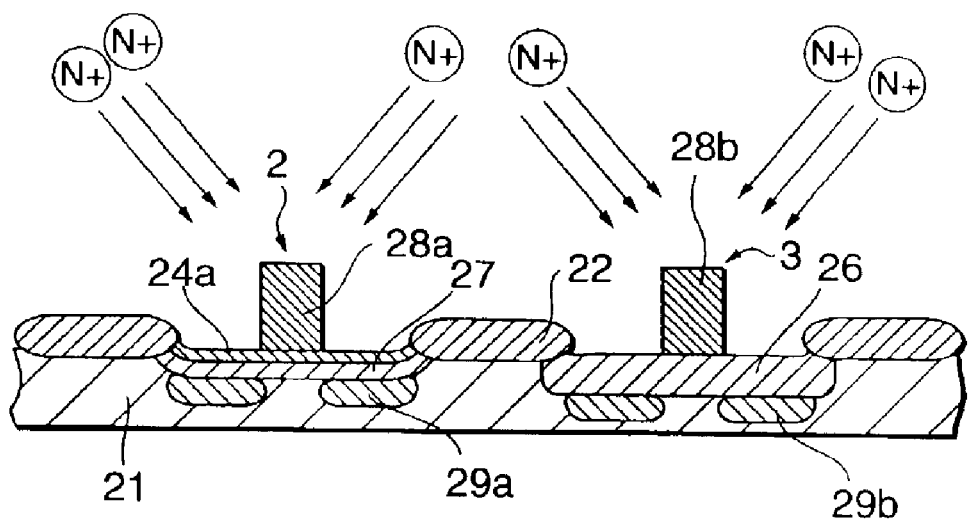
FIGS. 4(a) and 4(b) show the manufacturing steps of a fourth embodiment of the method for manufacturing a MOS transistor according to the present invention.

FIGS. 4(a) to 4 (g) show the manufacturing steps of a fourth embodiment of the method for manufacturing a MOS transistor according to the present invention.

When a MOS transistor operates, electric field in it becomes weaker at both sides of source and drain regions than at the center portion of gate insulating film. Therefore, its operation is not so influenced by nitrogen atoms even if comparatively many nitrogen atoms exist near these sides. So, taking advantage of this, nitrogen density at these sides can be enhanced to prevent impurities effectively from invading into oxide film.

Therefore, Embodiment 4 comprises what are added following processes to the manufacturing processes described in Embodiment 2.

Figure 4B:
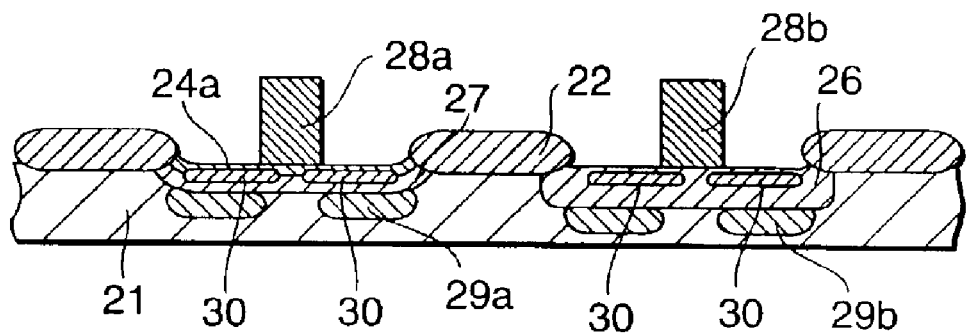

As shown in FIG. 4(a), after the process of Embodiment 2 shown in FIG. 2(g), nitrogen ions are implanted into the gate insulating films of MOS transistors at a dose of $10^{12}$ to $10^{16}$ per 1 cm$^2$, for example. These are coming in the direction slanted for each gate electrode 28a, 28b, at an accelerating voltage of 10 kV to 100 kV, for example. After this ion implantation, nitrogen atoms are segregated into silicon oxide layer 26, 27 in an in-oxidiz-able gas such as nitrogen gas (N2), by heat treatment at 700° C. to 1200° C., for example. By this heat treatment, as shown in FIG. 4(b), gate insulating film regions 30,30,30,30 are formed with a nitrogen density thicker than that in the oxide film directly beneath each gate electrode 28a, 28b.

In addition, the ion implantation, which is mentioned above, may be limited to specific regions where specific circuits are formed with masks such as photo-resist protection film etc. Moreover, the process of ion implantation can be performed as far as gate electrodes are already formed. It can be performed before diffusion layer is formed.

According to Embodiment 4, invasion of impurities is effectively prevented, because nitrogen density only near source and drain regions 29a, 29b are enhanced by gate insulating film regions 30 formed there.

Although, Embodiment 4 is described as an improved embodiment of Embodiment 2, it is apparent that Embodiment 1 and 3 are also improved as same as Embodiment 4.

In addition, as the high dielectric oxide film, in place of silicon oxide mentioned above, any of various kinds of high dielectric oxide films, such as Al2O3 (alumina), TiO2, ZrO2, (Ba, Sr) TO3, Pb (Zr, Ti) O3, may be used. Moreover, it goes without saying that both elements of Embodiment 1 and 2 can be formed together on the same chip.

What is claimed is:

1. A method for manufacturing a MOS transistor having a gate insulating film formed on an active region of a silicon semiconductor substrate, wherein processes of forming said gate insulating film comprise:

a process of forming a silicon oxide film containing nitrogen atoms on said active region;

a process of forming a silicon nitride layer at an interface between said silicon oxide film containing nitrogen atoms and said silicon substrate by heat-treating said silicon oxide film containing nitrogen atoms in a gas atmosphere absent of oxygen to segregate nitrogen atoms out of said silicon oxide film containing nitrogen atoms; and a process of forming a silicon oxide layer at an interface between said silicon nitride layer and said silicon substrate by removing the unnecessary silicon oxide film containing nitrogen atoms and heat-treating the silicon nitride layer in a gas atmosphere containing oxygen.

2. A method set forth in claim 1, wherein the process of forming a silicon nitride layer is performed by heat-treating in a di-nitrogen monoxide gas atmosphere.

3. A method set forth in claim 1, wherein the process of forming a silicon nitride layer is to carry out an annealing process in an atmosphere of nitrogen oxide.

4. A method set forth in claim 1, wherein the process of forming a silicon nitride layer comprises the steps of nitrogen ion implantation for introducing nitrogen content into said active region, and heat treatment for forming said silicon oxide film.

5. A method set forth in claim 1, wherein the process of forming a silicon nitride layer comprises an annealing process by rapid thermal annealing.

6. A method set forth in claim 1, where:

in the process of forming a silicon oxide film containing nitrogen atoms and the process of forming a silicon nitride layer; nitrogen is segregated out of the silicon oxide film containing nitrogen atoms on at least one active region of plural active regions; and by the process of forming the silicon oxide layer; a silicon oxide layer is formed with oxygen passing through the silicon nitride layer on the active regions having silicon nitride layer, at the same time, another silicon oxide layer thicker than the silicon oxide layer beneath the silicon nitride layer is formed on the active regions not having silicon nitride layer.

7. A method set forth in claim 1, where:

in the process of forming a silicon oxide film containing nitrogen atoms; silicon oxide films with nitrogen contents are formed on plural active regions of said silicon substrate; and in the process of forming a silicon nitride layer; nitrogen is segregated out of the silicon oxide film containing nitrogen atoms at the interface between the silicon substrate and the silicon oxide films on the plural active regions, unnecessary silicon oxide films on the silicon nitride layer is removed to expose segregated silicon nitride layer, at least one active region of plural active regions where exposed silicon nitride layer is needed, is covered with protection film; unnecessary silicon nitride layer is removed by etching; and the protection film is removed;

by this process, the silicon nitride layer is remained on at least one active region of plural active regions; and by the process of forming the silicon oxide layer; a silicon oxide layer is formed with oxygen passing through the silicon nitride layer on the active regions having silicon nitride layer, at the same time, another silicon oxide layer thicker than the silicon oxide layer beneath the silicon nitride layer is formed on the active regions not having silicon nitride layer.

8. A method set forth in claim 1, wherein the process of forming a silicon nitride layer is to carry out an annealing process in an atmosphere of nitrogen oxide;

in the process of forming a silicon oxide film containing nitrogen atoms and the process of forming a silicon nitride layer; nitrogen is segregated out of the silicon oxide film containing nitrogen atoms on at least one active region of plural active regions; and by the process of forming the silicon oxide layer; a silicon oxide layer is formed with oxygen passing through the silicon nitride layer on the active regions having silicon nitride layer, at the same time, another silicon oxide layer thicker than the silicon oxide layer beneath the silicon nitride layer is formed on the active regions not having silicon nitride layer.

9. A method set forth in claim 1, wherein the process of forming a silicon nitride layer comprises the steps of nitrogen ion implantation for introducing nitrogen content into said active region, and heat treatment for forming said silicon oxide film;

in the process of forming a silicon oxide film containing nitrogen atoms and the process of forming a silicon nitride layer; nitrogen is segregated out of the silicon oxide film containing nitrogen atoms on at least one active region of plural active regions; and by the process of forming the silicon oxide layer; a silicon oxide layer is formed with oxygen passing through the silicon nitride layer on the active regions having silicon nitride layer, at the same time, another silicon oxide layer thicker than the silicon oxide layer beneath the silicon nitride layer is formed on the active regions not having silicon nitride layer.

10. A method set forth in claim 1, wherein the process of forming a silicon nitride layer comprises an annealing process by rapid thermal annealing;

In the process of forming a silicon oxide film containing nitrogen atoms and the process of forming a silicon nitride layer; nitrogen is segregated out of the silicon oxide film containing nitrogen atoms on at least one active region of plural active regions; and by the process of forming the silicon oxide layer; a silicon oxide layer is formed with oxygen passing through the silicon nitride layer on the active regions having silicon nitride layer, at the same time, another silicon oxide layer thicker than the silicon oxide layer beneath the silicon nitride layer is formed on the active regions not having silicon nitride layer.

11. A method set forth in claim 1, wherein the process of forming a silicon nitride layer is performed by heat-treating in a di-nitrogen monoxide gas atmosphere;

in the process of forming a silicon oxide film containing nitrogen atoms and the process of forming a silicon nitride layer; nitrogen is segregated out of the silicon oxide film containing nitrogen atoms on at least one active region of plural active regions; and by the process of forming the silicon oxide layer; a silicon oxide layer is formed with oxygen passing through the silicon nitride layer on the active regions having silicon nitride layer, at the same time, another silicon oxide layer thicker than the silicon oxide layer beneath the silicon nitride layer is formed on the active regions not having silicon nitride layer.

12. A method set forth in claim 1, where:

in the process of forming a silicon oxide film containing nitrogen atoms and the process of forming a silicon nitride layer; nitrogen is segregated out of the silicon oxide film containing nitrogen atoms on at least one active region of plural active regions; and by the process of forming the silicon oxide layer; a silicon oxide layer is formed with oxygen passing through the silicon nitride layer on the active regions having silicon nitride layer, at the same time, another silicon oxide layer almost as thick as the silicon nitride layer, is formed on the active regions not having silicon nitride layer; and gate electrodes are formed respectively on the silicon nitride layer and silicon oxide layer, to form p-type MOS transistor with the silicon nitride layer and n-type MOS transistor with the silicon oxide layer.

13. A method set forth in claim 1, where:

in the process of forming a silicon oxide film containing nitrogen atoms; silicon oxide films with nitrogen contents are formed on plural active regions of said silicon substrate; and in the process of forming a silicon nitride layer; nitrogen segregated out of the silicon oxide film containing nitrogen atoms at the interface between the silicon substrate and the silicon oxide films on the plural active regions, unnecessary silicon oxide films on the silicon nitride layer is removed to expose segregated silicon nitride layer, at least one active region of plural active regions where exposed silicon nitride layer is needed, is covered with protection film; unnecessary silicon nitride layer is removed by etching; and the protection film is removed;

by this process, the silicon nitride layer is remained on at least one active region of plural active regions; and by the process of forming the silicon oxide layer; a silicon oxide layer is formed with oxygen passing through the silicon nitride layer on the active regions having silicon nitride layer, at the same time, another silicon oxide layer almost as thick as the silicon nitride layer, is formed on the active regions not having silicon nitride layer; and gate electrodes are formed respectively on the silicon nitride layer and silicon oxide layer, to form p-type MOS transistor with the silicon nitride layer and n-type MOS transistor with the silicon oxide layer.

14. A method set forth in claim 1, wherein the process of forming a silicon nitride layer is to carry out an annealing process in an atmosphere of nitrogen oxides;

in the process of forming a silicon oxide film containing nitrogen atoms and the process of forming a silicon nitride layer; nitrogen is segregated out of the silicon oxide film containing nitrogen atoms on at least one active region of plural active regions; and by the process of forming the silicon oxide layer; a silicon oxide layer is formed with oxygen passing through the silicon nitride layer on the active regions having silicon nitride layer, at the same time, another silicon oxide layer almost as thick as the silicon nitride layer, is formed on the active regions not having silicon nitride layer; and gate electrodes are formed respectively on the silicon nitride layer and silicon oxide layer, to form p-type MOS transistor with the silicon nitride layer and n-type MOS transistor with the silicon oxide layer.

15. A method set forth in claim 1, wherein the process of forming a silicon nitride layer comprises the steps of nitrogen ion implantation for introducing nitrogen content into said active region, and heat treatment for forming said silicon oxide film;

in the process of forming a silicon oxide film containing nitrogen atoms and the process of forming a silicon nitride layer; nitrogen is segregated out of the silicon oxide film containing nitrogen atoms on at least one active region of plural active regions; and by the process of forming the silicon oxide layer; a silicon oxide layer is formed with oxygen passing through the silicon nitride layer on the active regions having silicon nitride layer, at the same time, another silicon oxide layer almost as thick as the silicon nitride layer, is formed on the active regions not having silicon nitride layer, and gate electrodes are formed respectively on the silicon nitride layer and silicon oxide layer, to form p-type MOS transistor with the silicon nitride layer and n-type MOS transistor with the silicon oxide layer.

16. A method set forth in claim 1, wherein the process of forming a silicon nitride layer comprises an annealing process by rapid thermal annealing;

in the process of forming a silicon oxide film containing nitrogen atoms and the process of forming a silicon nitride layer; nitrogen is segregated out of the silicon oxide film containing nitrogen atoms on at least one active region of plural active regions; and by the process of forming the silicon oxide layer; a silicon oxide layer is formed with oxygen passing through the silicon nitride layer on the active regions having silicon nitride layer, at the same time, another silicon oxide layer almost as thick as the silicon nitride layer, is formed on the active regions not having silicon nitride layer; and gate electrodes are formed respectively on the silicon nitride layer and silicon oxide layer, to form p-type MOS transistor with the silicon nitride layer end n-type MOS transistor with the silicon oxide layer.

17. A method set forth in claim 1, wherein the process of forming a silicon nitride layer is performed by heat-treating in a di-nitrogen monoxide gas atmosphere;

in the process of forming a silicon oxide film containing nitrogen atoms and the process of forming a silicon nitride layer; nitrogen is segregated out of the silicon oxide film containing nitrogen atoms on at least one active region of plural active regions; and by the process of forming the silicon oxide layer; a silicon oxide layer is formed with oxygen passing through the silicon nitride layer on the active regions having silicon nitride layer, at the same time, another silicon oxide layer almost as thick as the silicon nitride layer, is formed on the active regions not having silicon nitride layer; and gate electrodes are formed respectively on the silicon nitride layer and silicon oxide layer, to form p-type MOS transistor with the silicon nitride layer and n-type MOS transistor with the silicon oxide layer.

18. A method set forth in claim 1, wherein added a process of introducing nitrogen ions into the gate insulating film and a process of enhancing nitrogen ion density by heat treatment, to segregate nitrogen ions into the oxide film after a process of forming gate electrodes.

19. A method set forth in claim 1, wherein added a process of introducing nitrogen ions into the gate insulating film and a process of enhancing nitrogen ion density by heat treatment, to segregate nitrogen ions in the oxide film after a process of forming gate electrodes; and the process of enhancing nitrogen ion density comprises an annealing process by rapid thermal annealing.

20. A method set forth in claim 1, wherein added a process of introducing nitrogen ions into specific circuit regions of the gate insulating film and a process of enhancing nitrogen ion density by heat treatment, to segregate nitrogen ions in the oxide film after a process of forming gate electrodes.

* * * * *